United States Patent
Li

(10) Patent No.: US 11,955,396 B2
(45) Date of Patent: Apr. 9, 2024

(54) SEMICONDUCTOR PACKAGING METHOD, SEMICONDUCTOR ASSEMBLY AND ELECTRONIC DEVICE COMPRISING SEMICONDUCTOR ASSEMBLY

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

(*) Notice: Subject to any disclaimer, the term of this patent is extended or adjusted under 35 U.S.C. 154(b) by 25 days.

(21) Appl. No.: 17/535,983

(22) Filed: Nov. 26, 2021

(65) Prior Publication Data
US 2022/0173004 A1   Jun. 2, 2022

(30) Foreign Application Priority Data

Nov. 27, 2020 (CN) .......................... 202011352624.1
Nov. 27, 2020 (CN) .......................... 202011353294.8

(51) Int. Cl.
*H01L 23/02*   (2006.01)
*H01L 23/00*   (2006.01)
*H01L 23/31*   (2006.01)

(52) U.S. Cl.
CPC .......... *H01L 23/3128* (2013.01); *H01L 24/16* (2013.01); *H01L 2224/16221* (2013.01);
(Continued)

(58) Field of Classification Search
CPC ................. H01L 21/56; H01L 24/16; H01L 2224/16157; H01L 2224/16221
(Continued)

(56) References Cited

U.S. PATENT DOCUMENTS 5,600,180 A * 2/1997 Kusaka ................... H01L 24/11
  257/737
6,809,421 B1 * 10/2004 Hayasaka ............... H01L 25/50
  257/621
(Continued)

FOREIGN PATENT DOCUMENTS

CN   102194718 A   9/2011
CN   103890933 A   6/2014
(Continued)

OTHER PUBLICATIONS

Shanghai Yibu Semiconductor Co., Ltd., English Translation of KR First Office Action, KR 10-2022-0074762, dated Mar. 28, 2023, 7 pgs.
(Continued)

*Primary Examiner* — Nitin Parekh
(74) *Attorney, Agent, or Firm* — USCH Law, PC

(57) ABSTRACT

A semiconductor packaging method, a semiconductor assembly and an electronic device comprising the semiconductor assembly are disclosed herein. The semiconductor packaging method comprises providing at least one semiconductor device and a carrier board. A plurality of first alignment solder parts are formed on a passive surface of the semiconductor device, and a plurality of corresponding second alignment solder parts are formed on the carrier board. The method further comprises forming a plurality of alignment solder joints by aligning and soldering the first alignment solder parts to respective ones of the second alignment solder parts whereby the semiconductor device is aligned and fixed to the carrier board; encapsulating the at least one semiconductor device to form a molded package body; sequentially forming a redistribution layer and external terminals on the molded package body so that the
(Continued)

connection terminals are connected to the external terminal through the interconnection layer.

20 Claims, 10 Drawing Sheets

(52) U.S. Cl.
CPC .............. *H01L 2224/73204* (2013.01); *H01L 2924/15311* (2013.01); *H01L 2924/181* (2013.01)

(58) Field of Classification Search
USPC .................................. 257/778, 737; 438/108
See application file for complete search history.

(56) References Cited

U.S. PATENT DOCUMENTS

| | | | |
|---|---|---|---|
| 10,847,435 B2 | 11/2020 | Kim et al. | |
| 2003/0062631 A1* | 4/2003 | Nemoto | H01L 24/78 257/784 |
| 2004/0262774 A1* | 12/2004 | Kang | H01L 24/11 257/E23.021 |
| 2007/0205520 A1 | 9/2007 | Chou et al. | |
| 2008/0284408 A1 | 11/2008 | Kunst et al. | |
| 2011/0074004 A1* | 3/2011 | Shen | H01L 24/97 257/E23.116 |
| 2012/0032321 A1* | 2/2012 | West | H01L 23/544 257/737 |
| 2013/0059416 A1 | 3/2013 | Liu et al. | |
| 2013/0244382 A1 | 9/2013 | Clark | |
| 2015/0255415 A1* | 9/2015 | De Bonis | H01L 25/50 438/126 |
| 2017/0358554 A1 | 12/2017 | Chen et al. | |
| 2019/0103375 A1* | 4/2019 | Huang | H01L 24/16 |
| 2020/0161183 A1 | 5/2020 | Lai et al. | |

FOREIGN PATENT DOCUMENTS

| | | |
|---|---|---|
| CN | 104037153 A | 9/2014 |
| CN | 102983087 B | 6/2015 |
| CN | 105244341 A | 1/2016 |
| CN | 105448862 A | 3/2016 |
| CN | 108028239 A | 5/2018 |
| CN | 109585312 A | 4/2019 |
| CN | 112018047 A | 12/2020 |
| KR | 20140070602 A | 6/2014 |
| KR | 20170026170 A | 2/2019 |
| TW | M507066 U | 8/2015 |
| TW | 201921620 A | 6/2019 |

OTHER PUBLICATIONS

Shanghai Yibu Semiconductor Co., Ltd., KR First Office Action with English Translation, KR 10-2021-01640040, dated Mar. 29, 2023, 11 pgs.
Shanghai Yibu Semiconductor Co., Ltd., KR Second Office Action with English Translation, KR 10-2021-01640040, dated Nov. 26, 2023, 13 pgs.
Shanghai Yibu Semiconductor Co., Ltd., KR First Office Action with English Translation, KR 10-2021-0164048, dated Nov. 6, 2023, 11 pgs.
Weiping Li, U.S. Appl. No. 17/535,986, Non-Final Office Action dated Jul. 20, 2023.

* cited by examiner

300

310
Providing at least one semiconductor device and a carrier board, each of the at least one semiconductor device respectively has an active surface and an opposing passive surface, the active surface is formed with connecting terminals, the passive surface is formed with a plurality of first alignment solder parts, and the carrier board is formed with a plurality of second alignment solder parts respectively corresponding to the plurality of first alignment solder parts

320
Placing the at least one semiconductor device on the surface of the carrier board such that the plurality of first alignment solder parts are substantially aligned with respective ones of the plurality of second alignment solder parts

330
Forming a plurality of alignment solder joints by soldering the plurality of first alignment solder parts to respective ones of the plurality of second alignment solder parts whereby the at least one semiconductor device is aligned and fixed to the carrier board

340
Encapsulating the at least one semiconductor device using a molding compound to form a molded package body on a side of the carrier board where the at least one semiconductor device is disposed

350
Exposing the interconnect terminals on the molded package body

360
Sequentially forming an interconnection layer and external terminals on a surface of the molded package body whereby the connection terminals are electrically connected to the external terminals through the interconnection layer

310 — Providing at least one semiconductor device and a carrier board, each of the at least one semiconductor device respectively has an active surface and an opposing passive surface, the active surface is formed with connecting terminals, the passive surface is formed with a plurality of first alignment solder parts, and the carrier board is formed with a plurality of second alignment solder parts respectively corresponding to the plurality of first alignment solder parts

320 — Placing the at least one semiconductor device on the surface of the carrier board such that the plurality of first alignment solder parts are substantially aligned with respective ones of the plurality of second alignment solder parts

330 — Forming a plurality of alignment solder joints by soldering the plurality of first alignment solder parts to respective ones of the plurality of second alignment solder parts whereby the at least one semiconductor device is aligned and fixed to the carrier board

331 — Turning the at least one semiconductor device and the carrier plate as a whole to enable the active surface to face downwards, melting or partially melting the plurality of alignment solder joints, and subsequently cooling and solidifying the plurality of alignment solder joints

340 — Encapsulating the at least one semiconductor device using a molding compound to form a molded package body on a side of the carrier board where the at least one semiconductor device is disposed

350 — Exposing the interconnect terminals on the molded package body

360 — Sequentially forming an interconnection layer and external terminals on a surface of the molded package body whereby the connection terminals are electrically connected to the external terminals through the interconnection layer

310 — Providing at least one semiconductor device and a carrier board, each of the at least one semiconductor device respectively has an active surface and an opposing passive surface, the active surface is formed with connecting terminals, the passive surface is formed with a plurality of first alignment solder parts, and the carrier board is formed with a plurality of second alignment solder parts respectively corresponding to the plurality of first alignment solder parts, the plurality of first and/or second alignment solders parts being pre-coated with viscous flux

320 — Placing the at least one semiconductor device on the surface of the carrier board such that the plurality of first alignment solder parts are substantially aligned with respective ones of the plurality of second alignment solder parts

330 — Forming a plurality of alignment solder joints by soldering the plurality of first alignment solder parts to respective ones of the plurality of second alignment solder parts whereby the at least one semiconductor device is aligned and fixed to the carrier board

330' — Before soldering, turning the at least one semiconductor device and the carrier plate as a whole to enable the active surface to face downwards, melting or partially melting the first alignment solder parts and the plurality of second alignment solder parts during soldering to form the plurality of alignment solder joints, which are elongated by the weight of the at least one semiconductor device

340 — Encapsulating the at least one semiconductor device using a molding compound to form a molded package body on a side of the carrier board where the at least one semiconductor device is disposed

350 — Exposing the interconnect terminals on the molded package body

360 — Sequentially forming an interconnection layer and external terminals on a surface of the molded package body whereby the connection terminals are electrically connected to the external terminals through the interconnection layer

FIG. 3B

SEMICONDUCTOR PACKAGING METHOD, SEMICONDUCTOR ASSEMBLY AND ELECTRONIC DEVICE COMPRISING SEMICONDUCTOR ASSEMBLY

CROSS REFERENCE TO RELATED APPLICATIONS

This application claims the benefit of priority under the Paris Convention to Chinese Patent Application No. CN202011353294.8, filed Nov. 27, 2020, entitled "Semiconductor Packaging Method, Semiconductor Assembly and Electronic Device Comprising Semiconductor Assembly," and Chinese Patent Application No. CN202011352624.1, filed Nov. 27, 2020, entitled "Semiconductor Packaging Method, Semiconductor Assembly and Electronic Device Comprising Semiconductor Assembly," each of which is incorporated by reference herein in its entirety. This application is related to co-pending U.S. patent application Ser. No. 17/535,986, entitled "Semiconductor Packaging Method, Semiconductor Assembly and Electronic Device Comprising Semiconductor Assembly," filed on even date herewith, which is incorporated by reference herein in its entirety.

FIELD OF THE INVENTION

The present application relates to the technical field of semiconductor manufacturing, in particular to a semiconductor packaging method, a semiconductor assembly and electronic device comprising the semiconductor assembly.

BACKGROUND

Semiconductor packages and systems that are compact, small, lightweight, and thin in design, while at the same time achieving high integration and versatility in function, are constantly being sought. Currently, various packaging technologies are proposed to meet the above-mentioned technical requirements, such as Fan-out (Fan-out) wafer level packaging, small chip packaging (chipset), heterogeneous integration (heterogenous integration), and 2.5-dimensional (2.5D) or three-dimensional (3D) packaging. These packaging techniques have different advantages and characteristics, but all present some technical challenges. Taking the existing fan-out package as an example, it faces many technical problems, such as warpage (warp), chip shift (die shift), surface flatness (topography), non-coplanarity between the chip and the molded package body (chip-to-mold non-planarity), package reliability (reliability), etc. Despite the continuing efforts in the industry to improve these technical problems by improving the equipment, materials, process elements, there is no economical and effective solution to some of the technical problems, especially problems such as warpage, chip drift, and surface coplanarity between different chips.

In addition, there are common techniques involved in the fabrication of various high-end semiconductor packages and systems, often involving the placement and attachment of semiconductor devices with high precision. This process step is usually performed by a high precision mounting (pick and place or die binder) equipment, which is very expensive. Still, the mounting speed is limited, resulting in low production speed, which becomes a bottleneck for the development and popularization of the technology.

Certain embodiments in the present application are directed to solving several of the core technical problems set forth above.

SUMMARY

Certain embodiments in the present application are directed to a novel semiconductor packaging method, semiconductor device and electronic device including the semiconductor device, which at least solve the above and other problems of the prior art.

An aspect of the present application provides a semiconductor packaging method, including providing at least one semiconductor device and a carrier board. Each of the at least one semiconductor device respectively has an active surface and a passive surface opposite to each other. The active surface is formed with connecting terminals, the passive surface is formed with a plurality of first alignment solder parts, and the carrier plate is formed with a plurality of second alignment solder parts respectively corresponding to the first alignment solder parts.

The semiconductor packaging method further includes: placing the at least one semiconductor device on the carrier board such that the plurality of first alignment solder parts are substantially aligned with the plurality of second alignment solder parts; forming a plurality of alignment solder joints by soldering the plurality of first alignment solder parts to the plurality of second alignment solder parts, or vice versa, so that the semiconductor device is aligned and fixed to the carrier board; forming a molded package body by encapsulating the at least one semiconductor device on the carrier board; exposing the connecting terminals from the molded package body; and sequentially forming an interconnection layer and an external terminal on a surface of the molded package body with the exposed connection terminals such that the connection terminals are electrically connected to the external terminal through the interconnection layer.

Another aspect of the present application provides a semiconductor device packaged by the above semiconductor packaging method.

Yet another aspect of the present application provides an electronic device including the semiconductor device described above.

It should be understood that the above description is only an overview of the present application so that the technical solutions of the present application can be more clearly understood and implemented according to the contents of the specification. In order to make the aforementioned and other objects, features and advantages of the present application more comprehensible, embodiments of the present application are described in detail below.

BRIEF DESCRIPTION OF THE DRAWINGS

The present embodiments are illustrated by way of example and not limitation in the figures of the accompanying drawings, in which like references indicate similar elements.

FIG. 3 shows a flow chart of a packaging method involving aligning a chip to a carrier board by forming alignment solder joints according to an embodiment of the application.

FIG. 3A shows a flow chart of a packaging method involving using weight of the chip to elongate the alignment solder joints to align the chip to a carrier board according to an embodiment of the application.

FIG. 3B shows a flow chart of a packaging method involving using weight of the chip to elongate alignment solder joints during formation of the alignment solder joints according to an embodiment of the application.

DETAILED DESCRIPTION OF THE EMBODIMENTS

Figure 1:
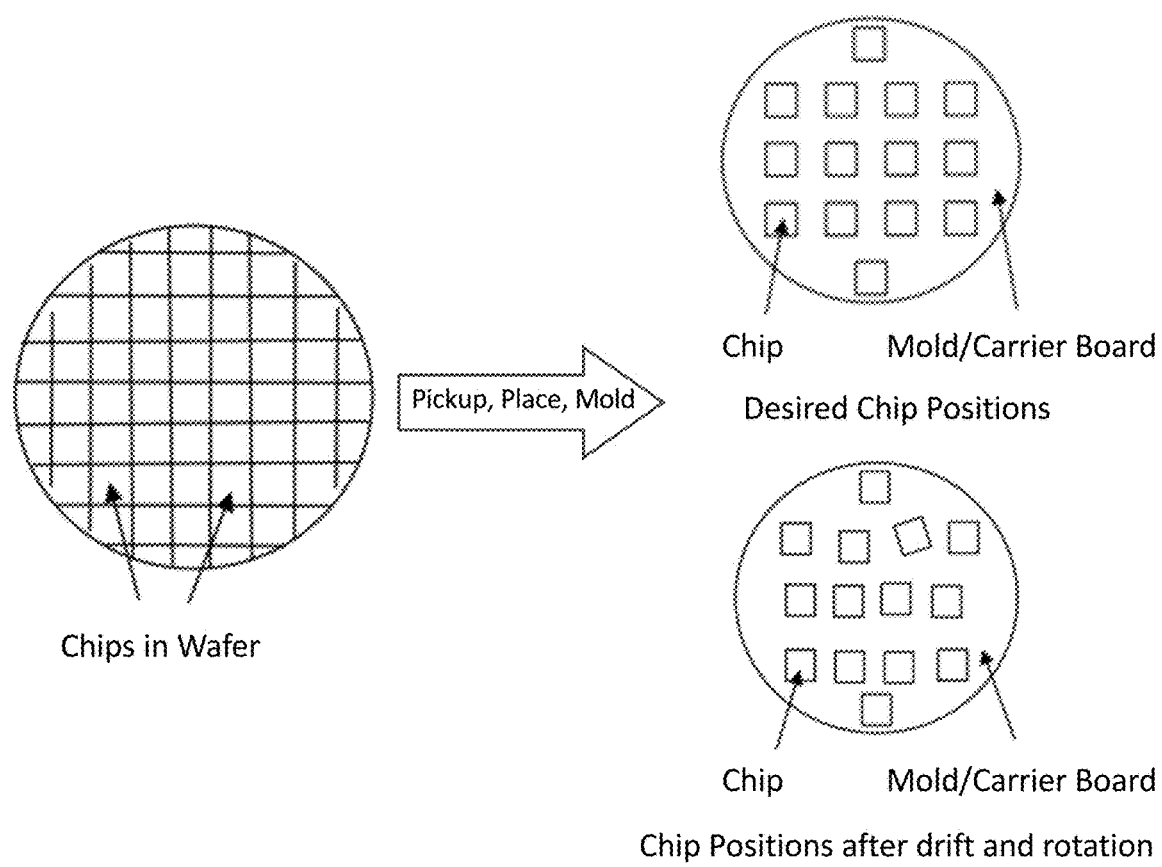
FIG. 1 is a schematic diagram illustrating a chip drift and a chip rotation phenomenon caused by a placement misalignment or a mold flow (mold flow) push during a chip-on-chip (chip-first) fan-out type package according to the related art.

The present application is intended in the following description to include at least one embodiment with reference to the accompanying drawings, in which like numerals represent the same or similar elements. Although the following description is based primarily on specific embodiments, it should be understood by those skilled in the art that the following description is intended to cover alternatives, modifications, and equivalents, which may be included within the spirit and scope of the present invention as defined by the appended claims and their equivalents, and as supported by the following description and drawings. In the following description, certain specific details are set forth, such as specific configurations, compositions, and processes, etc., in order to provide a thorough understanding of the present application. In other instances, well-known process and manufacturing techniques have not been described in detail in order to avoid unnecessarily obscuring the present application. Furthermore, the various embodiments shown in the figures are schematic representations and are not necessarily drawn to scale.

Semiconductor components (which may also be referred to as semiconductor packages) are a core component of modern electronic devices or products. Semiconductor components can be broadly classified in terms of device number and density into: discrete semiconductor devices, i.e., single chip devices, such as a single digital logic processor, diode, transistor; multi-chip components, such as a module of image sensors (CIS) and image processors (ASIC), a stack of a Central Processing Unit (CPU) and a dynamic memory (DRAM); and system level components, such as radio frequency Front End Modules (FEMs) in cell phones, display screen modules in cell phones and smart watches. Generally, the system-level package can include a wide variety of devices, including passive components (resistors, capacitors, inductors) and other devices or even components, in addition to semiconductor devices.

The semiconductor components herein may include active and passive devices including, but not limited to, active devices such as bipolar transistors, field effect transistors, integrated circuits, and passive devices such as chip resistors, capacitors, inductors, Integrated Passive Devices (IPDs), micro-electro-mechanical systems (MEMS), and the like. Various electrical connections are established between various active and passive devices to form circuits that enable the semiconductor assembly to perform high speed calculations and other useful functions.

Currently, semiconductor manufacturing typically involves two complex manufacturing processes, namely front-end wafer fabrication and back-end packaging, each of which may involve hundreds of steps. Previous wafer fabrication involves forming a plurality of chips (die) on the surface of the wafer. Each chip is generally identical and contains internally the circuits formed by the electrical connections of the active and/or passive elements. Subsequent packaging involves separating individual chips from the finished wafer and packaging them into semiconductor assemblies to provide electrical connections, structural support, heat dissipation, and environmental isolation, while facilitating subsequent assembly of the electronic product.

An important goal of semiconductor manufacturing is to produce smaller semiconductor devices, packages, and assemblies. Smaller sizes, generally higher integration, less power consumption, higher performance and smaller area/volume, are important to the performance of the final product. In one aspect, wafer fabrication can be improved to shrink chip sizes, increase circuit density and/or improve performance. In another aspect, subsequent packaging can be improved to further reduce the sizes, increase the density and improve the performance of the semiconductor assembly by improving the packaging design, process and packaging material.

In the back-end packaging process, a novel and efficient packaging method is the so-called fan-out packaging. Fan-out packaging is a packaging technique that wraps single or multiple qualified chips (die) from a diced wafer with a molding compound and routes interconnect traces from the chip's interconnect pads to external solder balls via a redistribution layer (RDL) to achieve higher I/O density and flexible integration. The fan-out type package may be mainly classified into a chip-first type package and a chip-last type package. Chip-first type packages can be classified into a face-down type and a face-up type.

The chip-first/face-down type packaging mainstream process comprises the following main steps: picking up chips from the cut wafer and placing the chips on a carrier board pasted with an adhesive film so that an active surface of the chips faces the adhesive film; encapsulating the chips using a molding compound; removing the carrier board (together with the adhesive film) to expose the active surface of the chip; forming an interconnection layer (including an RDL layer and Under Bump Metallization (UBM)) on an active surface of a chip; forming solder balls on the interconnection layer, wherein the interconnection pads or the interconnection bumps of the chip are electrically connected with the solder balls through the interconnection layer; and dicing to form individual semiconductor elements.

The chip-first/face-up type packaging process and the chip-first/face-down type packaging process can be approximately the same, and the main difference is as follows: picking up a chip and placing the chip on a carrier board pasted with an adhesive film, wherein the active surface of the chip is opposite to (or facing away from) the adhesive film; thinning the molded package body on one side of the active surface of the chip after encapsulation to expose the interconnection bumps on the active surface of the chip; and the carrier board may be removed after the formation of the interconnect layer and the solder balls.

Figure 2:
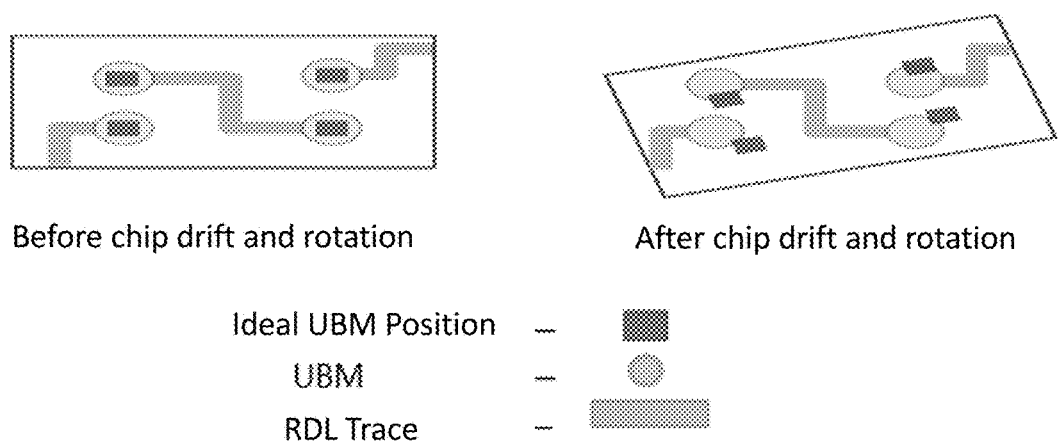
FIG. 2 shows a state diagram of Under Bump Metallization (UBM) and redistribution layer (RDL) trace position mismatch (or misalignment) formed after chip drift and rotation as shown in FIG. 1.

In the technical problem faced by the fan-out package at present, the high-precision placement and position fixing of the chip still lack an efficient and economical method. The higher the chip placement accuracy, the higher the equipment cost, the lower the production efficiency, and the more difficulty in breaking through the 0.5 micron limit of the chip mounting equipment. In addition, after a chip is placed on the adhesive film, which is used for bonding and fixing the chip, the flowing of the molding material can push the chip in the encapsulation process, so that the chip can be displaced and rotated on the adhesive film due to the deformability of the adhesive film. The higher temperatures used in the molding process further exacerbate this problem. Another source of chip displacement and rotation is internal stresses within the molded structure (the structure in which the chip and carrier are encapsulated d in a molding compound). Specifically, in the existing chip-first/face-down type packaging process, the encapsulation process comprises three stages: heating and injection molding, partial curing of a encapsulation material in high-temperature, and cooling, which are usually followed by a constant temperature heating step to fully cure the molding compound. The thermal expansion coefficients of the chip, the molding compound, the adhesive film, the carrier board, and the like are different, so the mismatch of the thermal expansion coefficients of various materials and the curing shrinkage of the molding compound in the encapsulation process cause uneven internal stress of the molding compound, which further causes chip drift and/or rotation (as shown in the chip arrangement at the lower right of FIG. 1) and warpage of the molded package body. Chip drift and/or rotation in turn causes positional mismatch or misalignment of subsequently formed RDL traces and UBMs (as shown in FIG. 2), which can result in a significant yield drop. The warpage of the molded package body causes difficulties in subsequent packaging processes including Under Bump Metallization (UBM) and redistribution line (RDL), and in severe cases even make it impossible to continue the process.

The present application aims to provide a novel and breakthrough packaging method that can at least solve the above technical problems.

A packaging method according to some embodiments utilizes self-alignment capability of alignment solder joints (joints) between a semiconductor device and a carrier board in a molten or partially molten state of solder to automatically and precisely align the semiconductor device to a target position on the carrier board and fix the position the semiconductor device after the solder is solidified In some embodiments, first alignment solder parts are pre-formed on the passive surface (i.e. the opposite surface of the active surface with interconnect terminals, which can be interconnect or contact pad, or interconnect or contact bumps) of the semiconductor device, and corresponding second alignment solder parts are formed on the carrier board. For example, one of a first alignment solder part and a corresponding second alignment solder part can be a solder bump, while the other of the first alignment solder part and the corresponding second alignment solder part can be a solder pad or solder bump. In some embodiments, after placing the semiconductor device at the target position on the carrier board by aligning the first alignment solder parts and the second alignment solder parts with each other, one (or both) of each respective first alignment solder part and its corresponding second alignment solder part are melted to form a respective alignment solder joint. At this point, if the semiconductor device is not precisely aligned to the target position on the carrier board (i.e., the first alignment solder part and the corresponding second alignment solder part are not aligned), the alignment solder joint in a molten or partially molten (liquid or partially liquid) state should automatically and precisely guides the semiconductor device to the target position to achieve surface energy minimization according to the principle of minimum surface energy, and the fused alignment solder joint keeps the semiconductor device firmly fixed at the target position after solidification. The first and second alignment solder parts are optimally designed (in terms including but not limited to volume, geometry, composition, location, distribution, and number, etc.) to enable the most accurate, efficient, and reliable self-alignment capability. Fixing the semiconductor device on the carrier board by adopting the soldering technique instead of the adhesive film bonding technique leads to many advantages. For example, the warping problem is improved, the possible drifting and rotating problems of the semiconductor device in the encapsulation process are prevented by the firm soldering joints, the placing deviation of a certain degree can be allowed when the semiconductor device is picked up and placed in view of the self-aligning capacity of the alignment solder joint, the requirement on the placing precision of the semiconductor device (especially for chip and place or die bonder) can be obviously reduced, the picking and placing operation speed of the semiconductor device can be obviously improved, the process efficiency is improved, and the process cost is reduced.

As used herein, the term "semiconductor device" may refer to a chip (also interchangeably referred to as die, integrated circuit) produced by a chip factory (fab), i.e., a chip that has not been packaged after wafer dicing and testing, and which may typically have only interconnect pads (pads) for external connection. The semiconductor device may also be a pre-processed (at least partially packaged) chip, such as with interconnect bumps (bump) formed on the interconnect pads, or may have additional structures, such as stacked chips and packaged chips, as desired.

The term "active surface" as used herein generally refers to a surface on a front side of a semiconductor device having a circuit function, including interconnect pads (or interconnect bumps formed on the interconnect pads) thereon, and may also be interchangeably referred to as a front surface or a functional surface. A surface having no circuit function on an opposing back side of the semiconductor device may be interchangeably referred to as a passive surface or a back surface.

The term "connection terminal" as used herein generally refers to an interconnect pad or an interconnect bump on the active surface of a semiconductor device.

The term "alignment solder part" as used herein generally refers to a structure that may be aligned and soldered to a corresponding other alignment solder part for alignment by soldering methods known in the art.

FIG. 3 shows a schematic flow diagram of a packaging method according to an embodiment of the present application. As shown in FIG. 3, the packaging method includes the following steps:

s310: providing at least one semiconductor device and a carrier board, wherein the semiconductor device respectively has an active surface and a passive surface opposite to each other, the active surface is formed with connection terminals thereon, the passive surface is formed with a plurality of first alignment solder parts thereon, and the carrier board is formed with a plurality of second alignment solder parts respectively corresponding to the first alignment solder parts.

In some embodiments, the at least one semiconductor device includes a plurality of semiconductor devices. As an example, the plurality of semiconductor devices may be at least partially different from each other in function, size, or shape, or may be the same as each other. It should be understood that the type and specific number of the semiconductor devices may be appropriately selected according to specific process conditions or actual requirements (for example, the size and shape of the carrier board and the semiconductor devices, the placement pitch or package size and shape of the semiconductor devices, manufacturing process specifications, functional design of semiconductor assemblies, etc.), and the present application is not particularly limited thereto.

In some embodiments, the carrier board or carrier is a glass carrier, a ceramic carrier, a metal carrier, an organic polymer material carrier, or a silicon wafer, or a combination of two or more of the above carriers.

In some embodiments, either one of a first alignment solder part and second alignment solder part is an alignment solder bump and the other is an alignment pad corresponding to the alignment solder bump. In other embodiments, the first alignment solder part and the second alignment solder part are both alignment solder bumps, and the melting points of the first alignment solder part and the second alignment solder part can be the same or different. As an example, the alignment solder bumps may be pre-fabricated on a semiconductor device (e.g., a wafer) or a carrier using a bumping process (e.g., electroplating, ball-planting, stencil printing, evaporation/sputtering, etc.) known in the art. As an example, the alignment pad may be fabricated on the semiconductor device or the carrier board in advance using a deposition (e.g., metal layer)-photolithography-etching process. It should be understood that any other weld configuration or form may be used as long as the first and second alignment welds are capable of being welded to each other for alignment purposes.

In some embodiments, the first alignment solder and the second alignment solder correspond to each other in volume, size, geometry, composition, distribution, location, and number, so that the semiconductor devices can be precisely aligned to the respective target positions on the carrier board by soldering to each other.

It should be understood that the specific volume, size, geometry, composition, distribution, location and number of the first alignment solder part and/or the second alignment solder part may be appropriately selected according to specific process conditions or actual requirements (for example, the size and shape of the carrier board and the semiconductor device, the placement pitch or package size and shape of the semiconductor device, etc.), and the present application is not particularly limited thereto. For example, the first alignment solder parts may be formed in substantially the same volume, size, geometry or composition for all semiconductor devices regardless of whether functions, sizes or shapes are identical to each other, and the second alignment solder parts on the carrier board may be formed in substantially the same volume, size, geometry or composition, so as to reduce the complexity of subsequent processes and improve the packaging efficiency. For another example, for semiconductor devices with different functions, sizes or shapes, the first alignment solder part and the second alignment solder part may be formed with different volumes, sizes, geometries or compositions so that different bond pad heights may be formed after subsequent bonding to achieve a particular function or to meet a particular requirement. In some embodiments, for a plurality of semiconductor devices, the first alignment solder part and/or the second alignment solder part are configured to enable active surfaces of the plurality of semiconductor devices to lie in a same plane parallel to a surface of the carrier board after subsequent formation of alignment bonds or joints. In some embodiments, for a plurality of semiconductor devices, the first alignment solder part and/or the second alignment solder part are configured to enable passive surfaces of the plurality of semiconductor devices to lie in a same plane parallel to the carrier board after subsequent formation of alignment solder parts. For another example, at least three first alignment solder parts distributed substantially regularly may be formed on each of the semiconductor devices, so that the passive surface of the semiconductor device can be firmly and stably maintained in a plane substantially parallel to the carrier board by the bonding of the first alignment solder parts and the second alignment solder parts.

Figure 4A:
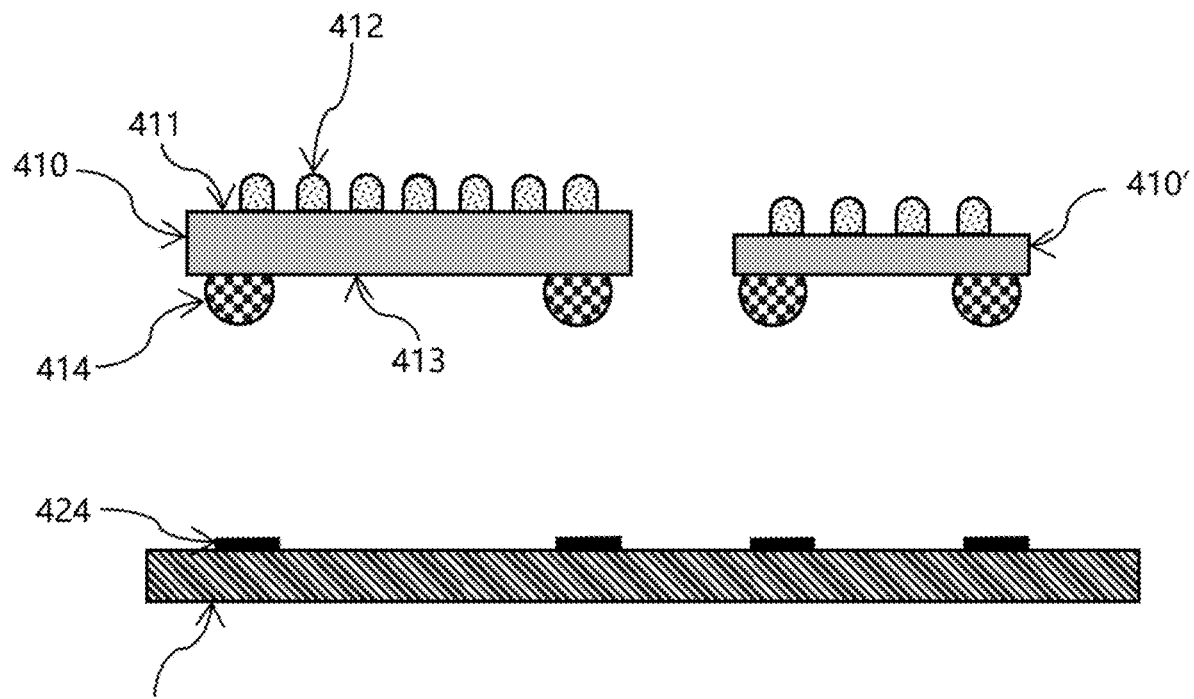
FIG. 4A to 4G show cross-sectional views for schematically illustrating a packaging method according to an exemplary embodiment of the present application.
Figure 4B:
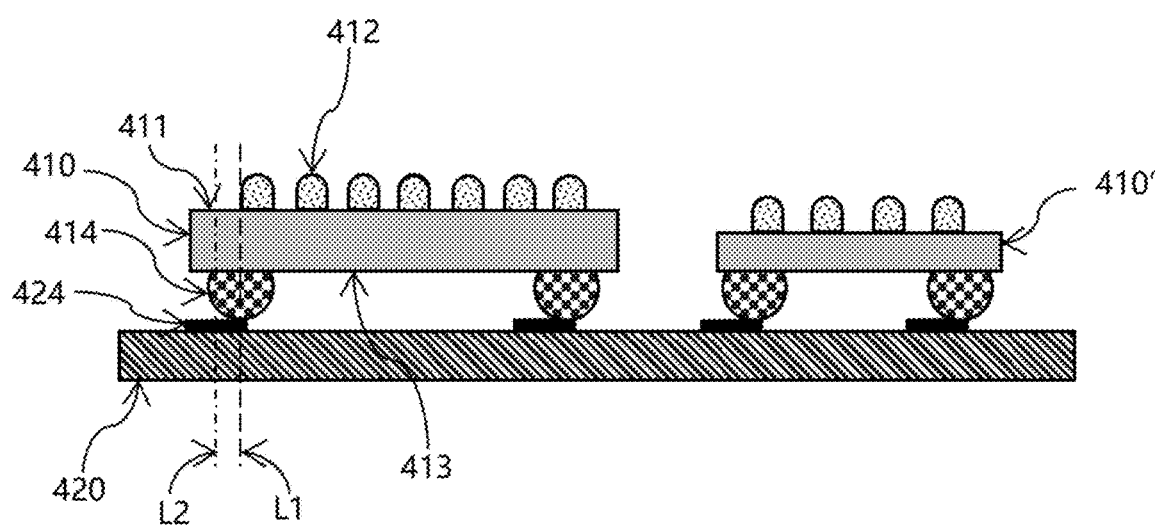
Figure 5A:
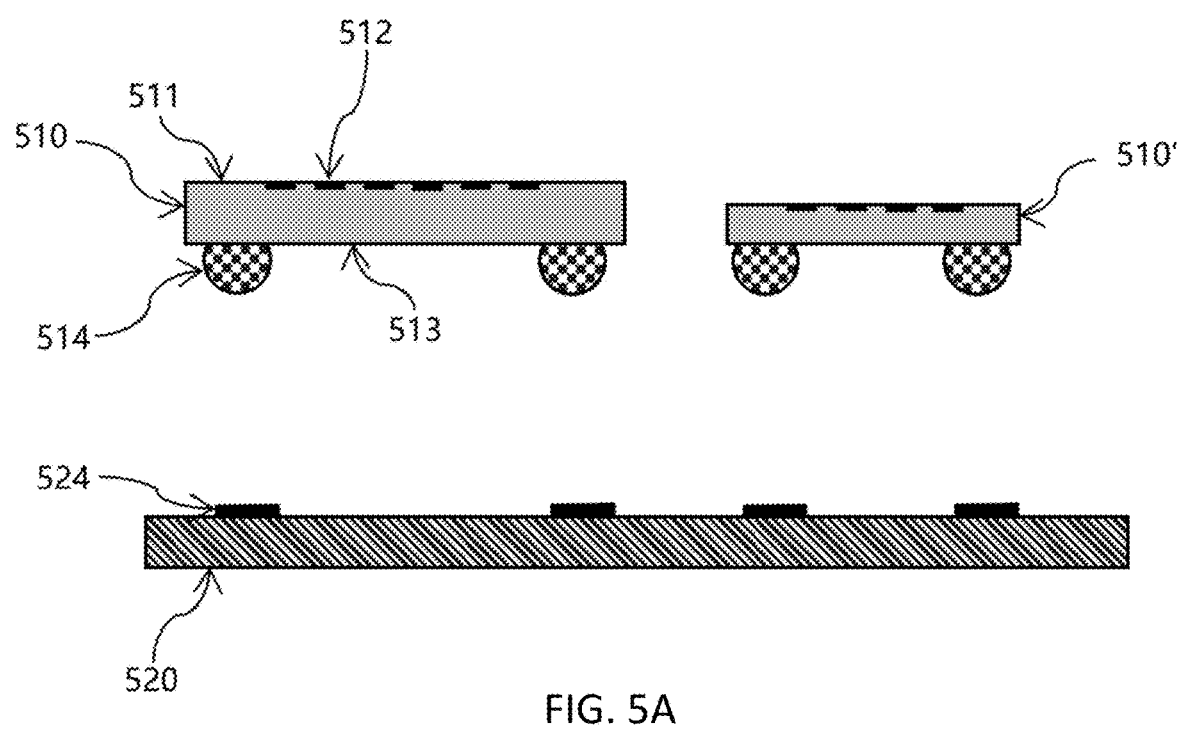
FIG. 5A to 5G show cross-sectional views for schematically illustrating a packaging method according to another exemplary embodiment of the present application.

In some embodiments, the connection terminals are interconnect bumps 414, as shown in FIG. 4A. By way of example, the interconnect bumps 414 may be pre-formed on interconnect pads on the semiconductor device using a bumping process known in the art (e.g., electroplating, ball-planting, stencil printing, evaporation/sputtering, etc.). For example, the interconnect bump may be in the form of a conductive pillar. In an alternative embodiment, the connection terminal is the interconnect pad itself, as shown in FIG. 5A.

S320: placing the at least one semiconductor device on the carrier board such that the plurality of first alignment solder parts are substantially aligned with the plurality of second alignment solder parts.

In some embodiments, the "substantial alignment" includes the first alignment solder part and the second alignment solder part contacting each other, respectively, without being precisely centered in a direction perpendicular to the passive surface. Here, "centered" is generally meant that the centers of the first and second alignment welds are aligned in a direction perpendicular to the active or passive surface. It should be noted that "substantial alignment" of the first alignment solder part with the second alignment solder part means that there is at least contact between the first alignment solder part and the second alignment solder part to the extent that self-alignment is possible by virtue of the principle of minimum surface energy of the alignment solder part in a molten or partially molten state during welding, as described below, and thus "substantial alignment" includes a state of imprecise alignment but at least physical contact, but may not exclude a state of exact alignment.

It should be understood that, when the semiconductor device is placed on the carrier board in step S320, the passive surface of the semiconductor device faces the carrier board (i.e., the surface on which the first alignment solder part is formed), and the active surface of the semiconductor device faces away from the carrier board.

S330: forming a plurality of alignment solder joints by soldering the plurality of first alignment solder parts and the plurality of second alignment solder parts so that the at least one semiconductor device is precisely aligned and fixed to the carrier board.

It should be noted that "precise alignment" indicates a state where a deviation between an actual position and a target position of the semiconductor device on the carrier board is within a tolerance in the art or a preset tolerance. It should be understood that the precise alignment is achieved using the principle of minimum surface energy exhibited by the solder joint or bonds formed by soldering the first and second alignment solder parts in a molten or partially molten state during soldering. In particular, when the first alignment solder part and the second alignment solder part are in contact with each other but are not precisely centered in a direction perpendicular to the passive surface of the semiconductor device or the carrier board, in the soldering process, one of the first alignment solder part and the second alignment solder part which is used as an alignment solder bump is melted or partially melted and wets the other one which is used as an alignment solder pad or another alignment solder bump, or both the first and second alignment solder parts melt or partially melt as alignment solder part bumps, thereby forming an alignment solder part in a molten or partially molten state In some embodiments, the alignment solder part in the molten or partially molten state tends to move in a deformation based on a minimum surface energy principle to bring the first alignment solder part and the second alignment solder part closer to a centered state, thereby driving the semiconductor device which is lighter relative to the carrier board to be accurately aligned to the target position on the carrier board.

It should be understood that after the first alignment solder part and the second alignment solder part are bonded for form a solder joint, the passive surface of the semiconductor device and the carrier board are spaced apart to form a certain space therebetween due to the height of the alignment solder joint itself (in a direction perpendicular to the passive surface of the semiconductor device or the carrier board) formed thereby.

In some embodiments, the alignment solder bump is made of solder, and the soldering may be performed by various means known in the art for melting solder, including but not limited to reflow soldering, laser soldering, high frequency soldering, infrared soldering, and the like.

In some embodiments, as shown in FIG. 3A, which illustrates a packaging method 300A, after S330, S331 is further included: in which the semiconductor device and the carrier board are turned over as a whole to enable the active surface of the semiconductor device to be downward faced, and the alignment solder joint is cooled after melting or partially melting the alignment solder joint again to solidify the alignment solder joint. It will be appreciated that the alignment solder joints, which are re-melted or partially melted at this time, are moderately elongated by the weight of the semiconductor device, whereby the self-alignment accuracy can be further improved. It should be noted that the semiconductor device will not fall off the carrier board due to its own weight because of the surface energy of the alignment solder in the molten state or the partially molten state. As an alternative embodiment, as shown in FIG. 3B, which illustrates a packaging method 300B, in S310, viscous flux is pre-coated on the plurality of first and/or second alignment solders, and S330 includes S330': before the soldering is performed, the semiconductor device and the carrier board are turned over as a whole so that the active surface of the semiconductor device faces downward. It should be appreciated that the alignment solder joints, which are melted or partially melted during soldering, are moderately elongated by the weight of the semiconductor device after being flipped at this time, whereby the self-alignment accuracy can be further improved. It should be noted that, since the viscous flux adheres the semiconductor device to the carrier, the semiconductor device would not fall off from the carrier due to its own weight after being turned over. It should be understood that before S340 described below, the semiconductor device and the carrier board as a whole need to be flipped again.

In some embodiments, when the semiconductor device includes a plurality of semiconductor devices, S330 further includes a flattening processing S330" performed on the active surfaces of the plurality of semiconductor devices by using a flattening plate (leveling plate) when the semiconductor devices are precisely aligned with the carrier board and the alignment solder joints are still in a molten or partially molten state, so that the active surfaces of the semiconductor devices are leveled with respect to each other to be basically positioned in a same plane parallel to the carrier board. As an example, Step S330" includes: placing the platen over the active surfaces of the plurality of semiconductor devices; pressing the platen toward the carrier board such that the active surfaces of the plurality of semiconductor devices lie substantially in a same plane parallel to the carrier board; while maintaining the pressing, cooling to substantially solidify the alignment weld; and removing the platen. As an alternative embodiment, when the semiconductor device is plural, after S330, the following flattening process S332 is further included: in which, after the alignment solder joints are melted or partially melted again, the active surfaces of the plurality of semiconductor devices are flattened by using a flattening plate so that the active surfaces of the plurality of semiconductor devices are basically positioned in a same plane parallel to the carrier board. As an example, Step S332 includes: melting or partially melting the alignment solder joints again; placing the platen over the active surfaces of the plurality of semiconductor devices; pressing the platen toward the carrier board such that the active surfaces of the plurality of semiconductor devices lie substantially in a same plane parallel to the carrier board; while maintaining the pressing, cooling to substantially solidify the alignment weld; and removing the platen. It will be appreciated that since the platen is not removed until the alignment solder joint has substantially solidified, the surface energy of the molten pad is prevented from restoring the semiconductor device to its original height prior to the platen.

Thus, the active surfaces of all semiconductor devices can be precisely flush and at the same height. It will be appreciated that a suitable pressure needs to be applied to the platen such that the alignment solder joints in the molten or partially molten state are suitably deformed and the resulting vertical (with respect to the active surface of the semiconductor device or the carrier board) displacement of the platen is suitable to prevent damage to the semiconductor device. As an example, a solder trap (solder trap) is formed in advance around each second alignment solder part of the carrier board, thereby preventing uncontrolled random flow of excess molten solder during the pressing process.

In some embodiments, the flattening process using a flattening plate described above is combined with the solder process or the remelting process after the inversion described above. As an example, S330" is performed after S330' is performed in S330, or S332 is performed after S330 including S330' is performed, or S331 is performed after S330 including S332" is performed, or S332 is performed when S331 is performed.

S340: forming a molded package body by encapsulating the semiconductor devices on the side of the carrier board where the semiconductor device is disposed in a molding compound.

It should be understood that by the encapsulation not only the active surface) and the side surfaces of the semiconductor device are encapsulated, but the space between the passive surface of the semiconductor device and the carrier board is also filled with the molding compound.

In some embodiments, the molding encapsulation is performed using a molding compound of a resinous material (e.g., epoxy).

In some embodiments, the molding is performed using a molding process such as injection molding, printing, and optionally in combination with an underfill (underfil) process.

S350: the connecting terminal is exposed from the molded package body.

In some embodiments, when the connection terminals are interconnect bumps, the interconnect bumps are exposed by thinning (e.g., grinding, etching, or ablating, etc.) the molded package body.

In some embodiments, when the connection terminal is an interconnection pad, the interconnection pad is exposed by forming an opening on the molded package body. By way of example, the openings may be formed using laser ablation (e.g., laser drilling). By way of example, the openings may be formed by mechanical drilling. As an example, prior to forming the opening, the molded package body may be thinned to meet product design requirements and/or to facilitate the opening.

S360: sequentially forming a redistribution layer and external terminals on a surface of the molded package body wherein the interconnect terminals are exposed whereby the interconnect terminals are electrically coupled to the external terminals through the redistribution layer.

In some embodiments, the interconnection layer includes a redistribution layer (RDL) and an Under Bump Metallization (UBM) in this order in a direction away from the connection terminal, thereby achieving conductive connection of the connection terminal with the external terminal. It should be understood that the interconnect layer further includes an insulating layer for achieving electrical insulation between the conductive paths, and the specific number and material of the insulating layer may be appropriately selected according to specific process conditions or needs, which is not particularly limited in the present application.

In some embodiments, the external terminals are solder balls.

In some embodiments, the external terminal is a pad.

In some embodiments, the packaging method further comprises: removing the carrier board between S340 and S350 or between S350 and S360 or after S360.

In some embodiments, the carrier board is removed by lift-off, etching, ablation, grinding, and the like, as known in the art. As an example, when a lift-off process is used, the solder between the carrier board and the semiconductor device (i.e. the alignment pads) may be de-soldered to facilitate the lift-off of the carrier board from the molded package body.

In some embodiments, some or all of the alignment pads are also removed while or after the carrier board is removed. By way of example, some or all of the alignment pads may be removed by de-soldering, etching, ablating, or grinding, among other processes known in the art. In some embodiments, some or all of the alignment pads are left as part of the final semiconductor assembly (i.e., the finished package) for electrical connections (e.g., power and ground), heat sinking, mechanical structures, etc.

In some embodiments, after removing the carrier board, the method further comprises: thinning (such as grinding, etching or ablating and the like on the surface of the plastic package body, from which the carrier board is removed). As an example, the package body may be thinned to the passive surface of the semiconductor device, or the thinned portion comprises a portion of the semiconductor device on the passive surface side of the semiconductor device. It should be understood that the alignment pads remaining after the carrier board is removed may also be removed by the thinning process. This can further reduce the thickness of the final semiconductor module.

In some embodiments, passive devices are also packaged with the semiconductor device in substantially the same manner as the embodiments described above.

In some embodiments, the packaging method further comprises, after S360, dicing the package body to obtain individual packages.

It should be understood that the dicing process may be performed to fabricate individual semiconductor devices or not performed according to the packaging specifications of the semiconductor devices, including but not limited to wafer level packaging, chip level packaging, system level packaging.

Hereinafter, the packaging method according to the present application will be described in more detail with reference to exemplary embodiments.

FIG. 4A to 4G show cross-sectional views for schematically illustrating a packaging method according to an exemplary embodiment of the present application.

As shown in FIG. 4A, a plurality of semiconductor devices and a carrier board 420 are provided. At least two of the semiconductor devices 410, 410' are different, e.g., different in size and/or function, among the plurality of semiconductor devices. A plurality of interconnection bumps 412 conductively connected to interconnection pads (not shown), respectively, are distributed on the active surface 411 of each semiconductor device 410 (and/or 410'), and a plurality of alignment solder bumps 414 are formed on the passive surface 413. A plurality of alignment pads 424 are formed on a surface of the carrier board 420 in the same arrangement (or relative position) as the alignment bumps 412 on each semiconductor device 410 (and/or 410'). Alternatively, passive devices may be provided in a similar structure in addition to semiconductor devices. For example, reference numeral 410' as shown in FIG. 4 may be replaced with a passive device.

As shown in FIG. 4lB, the semiconductor device 410 (and/or 410') is placed on the carrier board 420 such that the alignment solder bumps 414 are in contact with the corresponding alignment pads 424. At this point, alignment solder bump 414 is misaligned with alignment pad 424 (i.e., vertical centerline L1 of alignment solder bump 414 and vertical centerline L2 of alignment pad 424 are not coincident).

Figure 4C:
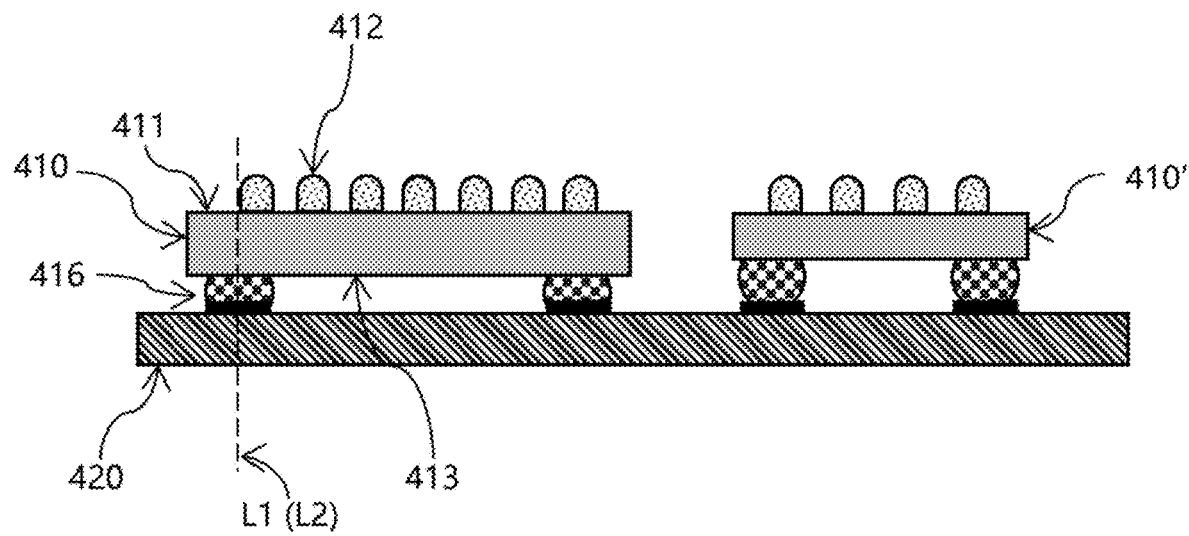

As shown in FIG. 4C, alignment solder bumps 414 and alignment pads 424 are soldered (e.g., by reflow) to form alignment pads 416. During the soldering process, the alignment solder bump 414 in a molten state wets the alignment pad 424 and self-aligns with the alignment pad 424 based on its minimum surface energy principle (i.e., the vertical center line L1 of the alignment solder bump 414 coincides with the vertical center line L2 of the alignment pad 424), so that the semiconductor device 410 (and/or 410') is brought into precise alignment on the carrier board 420. After the soldering is completed, the passive surface 413 of the semiconductor device 410 (and/or 410') is spaced apart from the carrier board 420 to form a space.

Figure 4D:
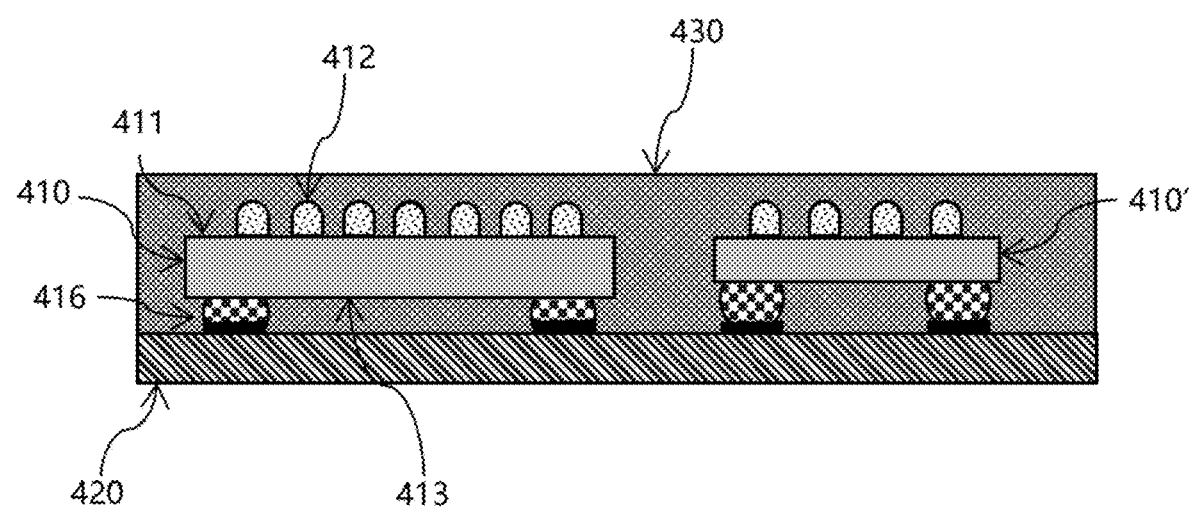

As shown in FIG. 4D, the side of the carrier board 420 to which the semiconductor device 410 (and/or 410') is bonded is subjected to an encapsulation process. A molding compound 430 encapsulates all surfaces of the semiconductor device 410 (and/or 410'), including the active surface 411 (and the interconnect bumps 412), the passive surface 413, and the side surfaces. The space below the passive surface 413 may filled using an underfill process.

Figure 4E:
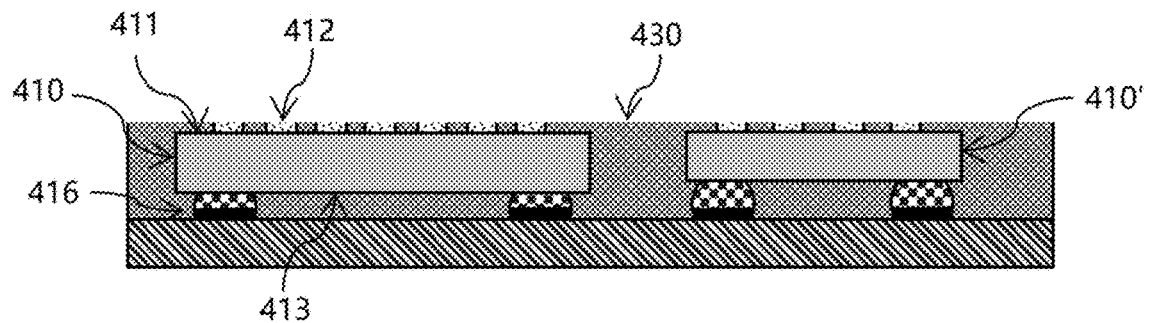

As shown in FIG. 4E the side of the molded package body 430 where the active surface 411 (or the interconnect bumps 412) are located is thinned until the interconnect bumps 412 are exposed.

Figure 4F:
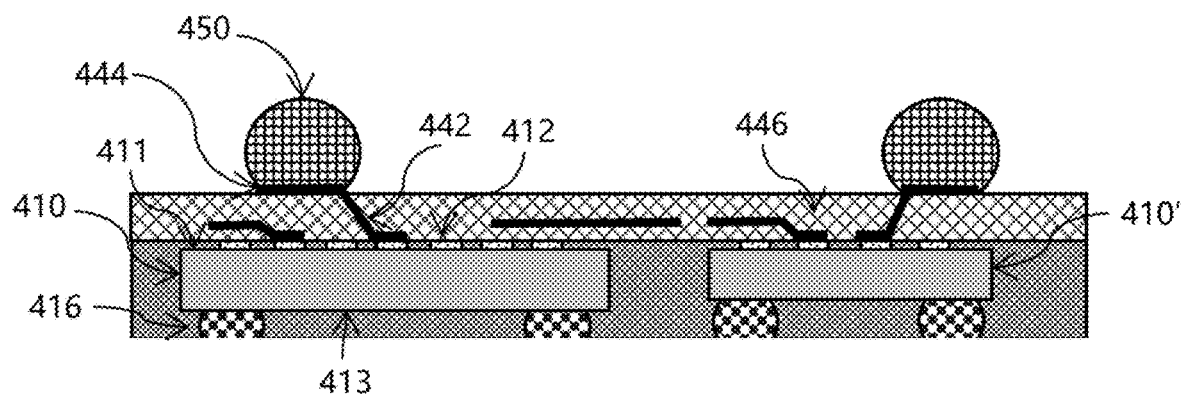

As shown in FIG. 4F, a redistribution layer (RDL) trace 442, a UBM 444, and solder balls 450 are sequentially formed on the surface of the molded package body 430 where the interconnect bump 414 is exposed, so as to form a conductive path from the interconnect bump 414 to the corresponding solder ball 450. In this process, a dielectric layer 446 is also formed to electrically insulate between the conductive paths, particularly when forming RDL traces 442 and/or UBM 444. Then, the carrier 420 is removed from the plastic package body 430. When the carrier board 420 is removed, a portion of the alignment pads 416 (including the alignment pads 424) may also be removed at the same time or afterwards.

Figure 4G:
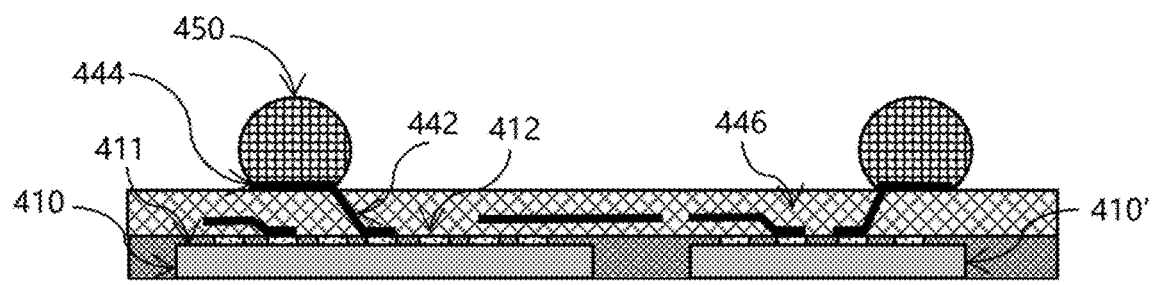

As shown in FIG. 4G, the other surface of the molded package body 430 (i.e., the side where the carrier board 420 is removed) is thinned to remove the remaining alignment pads 416 and a portion of the side of the inactive surface 413 of the semiconductor device 410 (and/or 410').

It should be understood that other processing (e.g., additional processing required for heterogeneous integrated packaging) may be further performed before, during, or after the steps of the packaging method described above, depending on the actual packaging needs.

Finally, although not shown, dicing (singulation) may be performed according to the packaging specifications of the semiconductor device to complete the fabrication of the individual semiconductor devices.

FIG. 5A to 5G show cross-sectional views for schematically illustrating a packaging method according to another exemplary embodiment of the present application. It is to be noted that the same or similar parts as those of the foregoing exemplary embodiment according to FIG. 4A to 4G will not be described again hereinafter.

As shown in FIG. 5A, a plurality of semiconductor devices and a carrier board 520 are provided. A plurality of interconnect pads 512 are distributed on the active surface 511 of each semiconductor device 510 (and/or 510'), and a plurality of alignment solder bumps 514 are formed on the passive surface 513. A plurality of alignment pads 524 are formed on a surface of the carrier 520.

Figure 5B:
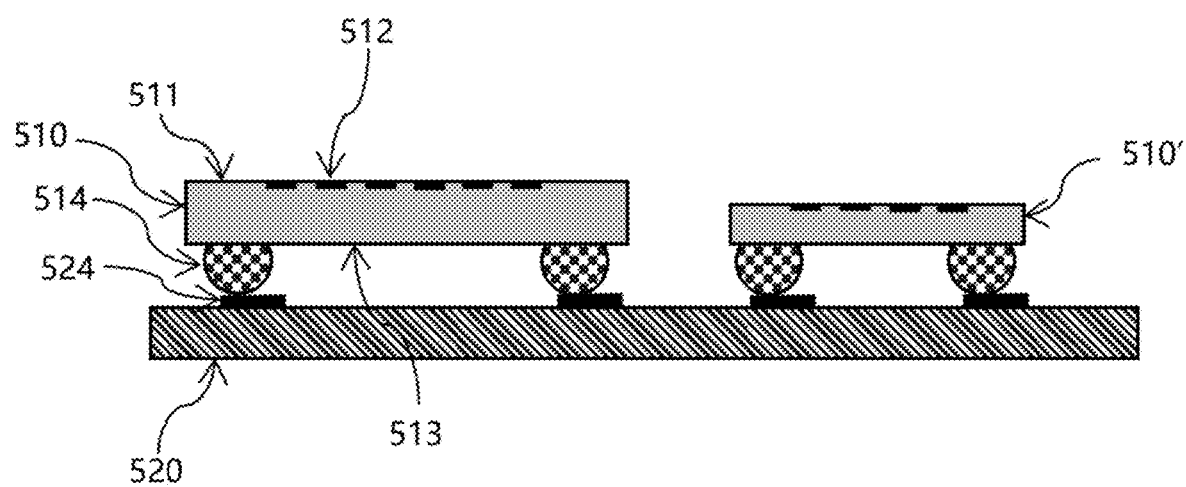

As shown in FIG. 5B, semiconductor device 510 (and/or 510') is placed on carrier board 520 such that alignment solder bumps 514 contact corresponding alignment pads 524. At this point, the alignment solder bump 514 may be somewhat misaligned with the alignment pad 524.

Figure 5C:
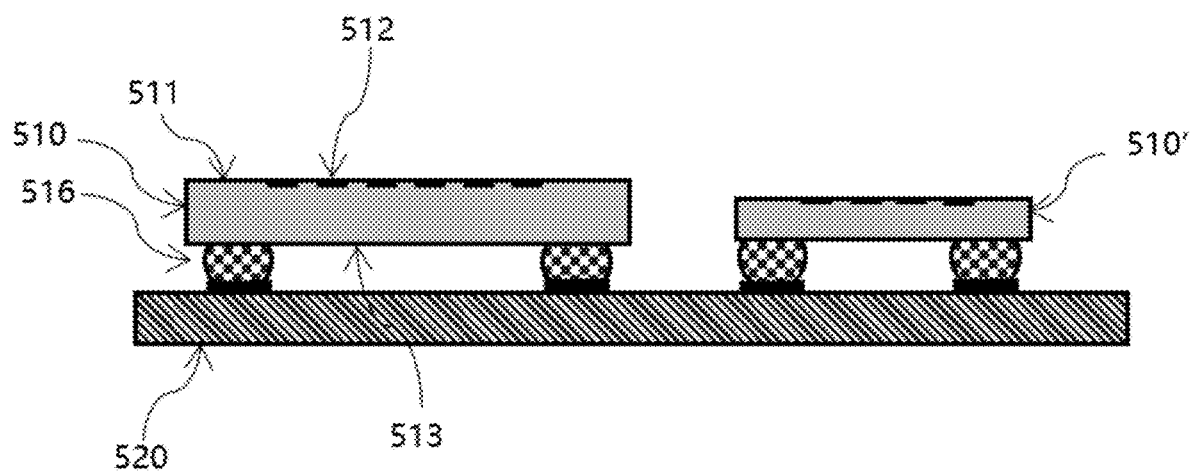

As shown in FIG. 5C, alignment solder bumps 514 and alignment pads 520 are soldered to form alignment solder joints 516, thereby achieving precise alignment of semiconductor device 510 (and/or 510') on carrier board 520 based on the principle of minimum surface energy.

Figure 5D:
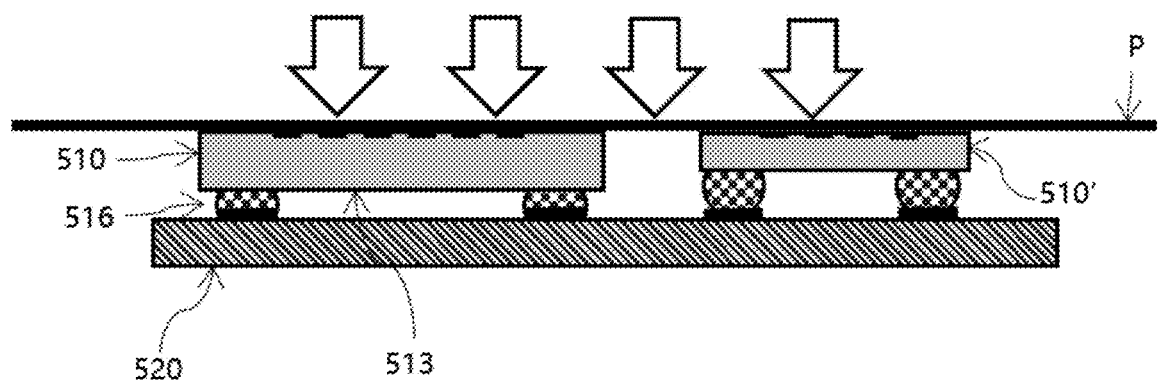

As shown in FIG. 5D, after the pressing plate P is placed on the active surface 511 of the semiconductor device 510 (and/or 510') while the alignment joints 516 are still in a molten state, the pressing plate P is pressed (i.e. toward the carrier board 520) to performing a pressing process such that the active surfaces of the plurality of semiconductor devices 510, 510' are in the same plane parallel to the carrier board 520. Subsequently, the temperature is decreased while the pressing is maintained to solidify the alignment solder joints 516, and then the platen P is removed.

Figure 5E:
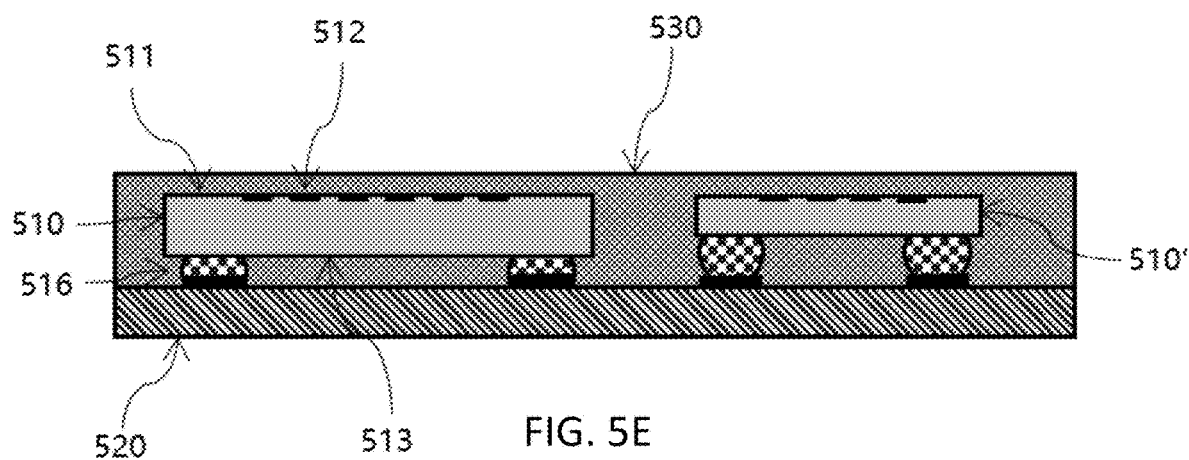

As shown in FIG. 5E, the side of the carrier board 520 to which the semiconductor devices 510 (and/or 510') are bonded is subjected to an encapsulation process. The molding compound 530 encapsulates all surfaces of the semiconductor device 510 (and/or 510').

Figure 5F:
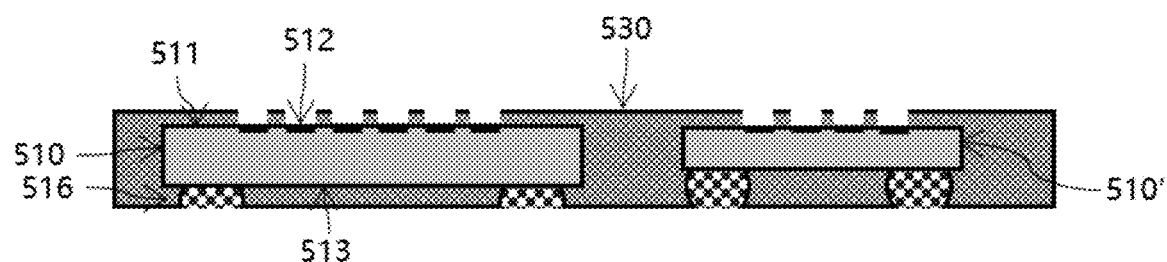

As shown in FIG. 5F, the carrier 520 is removed from the molded package body 530 and turned upside down. Subsequently, the side of the molded package body 530 where the active surface 511 (or the interconnect pads 512) is drilled (e.g., laser drilled) to expose the interconnect pad 512. Before drilling, the molded package body 530 can be thinned as needed.

Figure 5G:
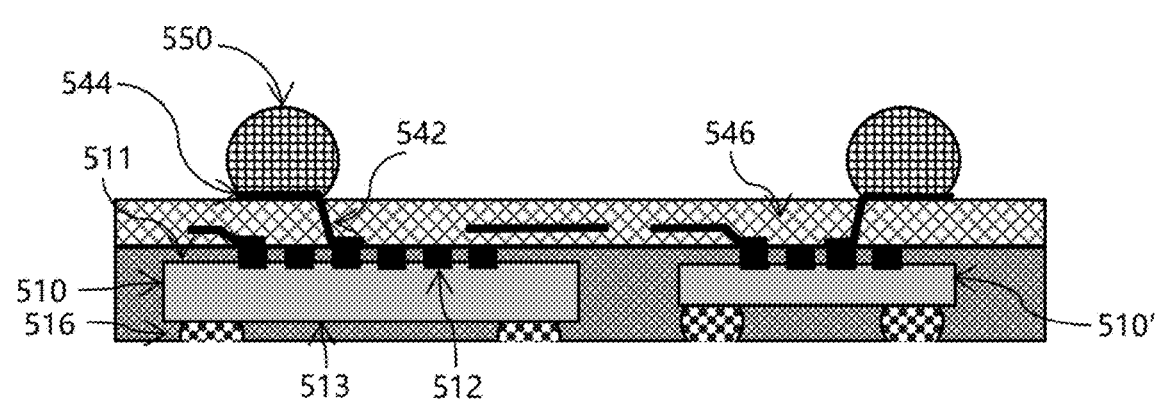

As shown in FIG. 5G, redistribution layer (RDL) traces 542, UBM 544, and solder balls 550 are sequentially formed on the surface of the molded package body 530 where the interconnect pads 512 are exposed, to form conductive paths from the interconnect pads 512 to the corresponding solder balls 550. In this process, a dielectric layer 546 is also formed to electrically isolate the conductive paths, particularly when forming RDL traces 542 and/or UBMs 544.

Finally, although not shown, dicing may be performed according to the functional design specifications of the semiconductor device to complete the fabrication of individual semiconductor devices.

It is apparent that those skilled in the art can make various changes and modifications to the embodiments of the present application without departing from the spirit and scope of the application. Thus, to the extent that such modifications and variations fall within the scope of the claims and their equivalents, it is intended that the present disclosure encompass such modifications and variations as well.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A semiconductor packaging method, comprising:
  providing at least one semiconductor device and a carrier board, wherein each of the at least one semiconductor device respectively has an active surface and an opposing passive surface, the active surface is formed with connection terminals, the passive surface is formed with a plurality of first alignment solder parts, and the carrier board is formed with a plurality of second alignment solder parts respectively corresponding to the plurality of first alignment solder parts;

placing the at least one semiconductor device on a surface of the carrier board such that the plurality of first alignment solder parts are substantially aligned with respective ones of the plurality of second alignment solder parts;

forming a plurality of alignment solder joints by soldering the plurality of first alignment solder parts to respective ones of the plurality of second alignment solder parts whereby the at least one semiconductor device is aligned and fixed to the carrier board;

encapsulating the at least one semiconductor device using a molding compound to form a molded package body on a side of the carrier board where the at least one semiconductor device is disposed;

exposing the connection terminals from the molded package body; and sequentially forming an interconnection layer and external terminals on a surface of the molded package body whereby the connection terminals are electrically connected to the external terminals through the interconnection layer;

wherein one of a respective first alignment solder part and a corresponding second alignment solder part is a solder bump, and the other of the respective first alignment solder part and the corresponding second alignment solder part is a solder pad or a solder bump;

wherein at least the first or second alignment solder bumps are made of solder, and soldering is performed by melting the solder;

the method further comprising, after forming a plurality of alignment solder joints, further aligning the at least one semiconductor device to the carrier board by: turning the at least one semiconductor device and the carrier board as a whole to enable the active surface to face downwards, melting or partially melting the plurality of alignment solder joints, and subsequently cooling and solidifying the plurality of alignment solder joints while the active surface faces downwards.

2. A semiconductor packaging method according to claim 1, wherein placing the at least one semiconductor device on the surface of the carrier board such that the plurality of first alignment solder parts are substantially aligned with the plurality of second alignment solder parts comprises: placing the at least one semiconductor device on the surface of the carrier board such that the plurality of first alignment solder parts at least touches respective ones of the plurality of second alignment solder parts.

3. A semiconductor packaging method according to claim 1, wherein the at least one semiconductor device includes a plurality of semiconductor devices, the method further comprising, after the plurality of semiconductor devices are aligned with the carrier board and while the plurality of alignment solder joints are still in a molten or partially molten state, flattening the active surfaces of the plurality of semiconductor devices using a flattening plate so that the active surfaces of the plurality of semiconductor devices are positioned in a same plane parallel to the carrier board until the alignment solder joints are solidified or mostly solidified, and subsequently removing the flattening plate.

4. A semiconductor packaging method according to claim 1, wherein the at least one semiconductor device includes a plurality of semiconductor devices each having an active surface and an opposing passive surface, and wherein the semiconductor packaging method further comprises, after forming the plurality of alignment solder joints, melting or partially melting the alignment solder joints again, flattening the active surfaces of the plurality of semiconductor devices using a flattening plate until the alignment solder joints are solidified so that the active surfaces of the plurality of semiconductor devices are positioned in a same plane parallel to the carrier board, and subsequently removing the flattening plate.

5. A semiconductor packaging method according to claim 1, further comprising, after forming the molded package body or after sequentially forming the interconnection layer and the external terminals: removing the carrier board.

6. A semiconductor packaging method according to claim 5, further comprising: thinning the molded package body, after the carrier board is removed.

7. A semiconductor packaging method according to claim 5, wherein thinning the molded package body includes removing a portion of the at least one semiconductor device on a side of the at least one semiconductor device on which the passive surface is located.

8. A semiconductor packaging method according to claim 5, further comprising: after the interconnection layer and the external terminals are formed, dicing the molded package body to obtain at least one semiconductor package.

9. A semiconductor packaging method according to claim 5, further comprising: when the carrier board is removed or after the carrier board is removed, removing at least part of the alignment solder joints.

10. A semiconductor packaging method according to claim 5, wherein the alignment solder joints are at least partially retained when the carrier board is removed or after the carrier board is removed for at least one of electrical connection, heat dissipation and mechanical structure of a semiconductor component made by the semiconductor packaging method.

11. A semiconductor packaging method according to claim 1, wherein the connection terminals are interconnection bumps, and exposing the connection terminals from the molded package body comprises: thinning the molded package body to expose the interconnection bumps.

12. A semiconductor packaging method according to claim 1, wherein the connection terminals are interconnection pads, and exposing the connection terminals from the molded package body comprises: forming openings in the molding compound to expose the interconnect pads in respective openings.

13. A semiconductor packaging method according to claim 1, wherein the interconnection layer comprises a re-distribution layer and an under-bump metallization layer.

14. A semiconductor component made by the semiconductor packaging method according to claim 1.

15. An electronic device comprising the semiconductor component of claim 14.

16. A semiconductor packaging method according to claim 1, wherein the plurality of alignment solder joints are elongated by weight of the at least one semiconductor device when the plurality of alignment solder joints are melted or partially melted while the active surface faces downwards, further aligning the at least one semiconductor device to the carrier board.

17. A semiconductor packaging method, comprising:
providing a set of semiconductor devices and a carrier board, the set of semiconductor devices having respective active surfaces and opposing passive surfaces, connection terminals formed on the active surfaces, and first alignment solder parts formed on the passive surfaces, the carrier board having second alignment solder parts respectively corresponding to the first alignment solder parts;

placing the set of semiconductor devices on the carrier board such that the first alignment solder parts contact respective ones of the second alignment solder parts;

forming alignment solder joints by soldering the first alignment solder parts to respective ones of the second alignment solder parts whereby the set of semiconductor devices are aligned and fixed to the carrier board;

encapsulating the set of semiconductor device using a molding compound to form a molded package body on a side of the carrier board where the set of semiconductor device are disposed;

exposing the connection terminals from the molded package body; and sequentially forming an interconnection layer and external terminals on a side of the molded package body where the connection terminals are exposed, wherein the connection terminals are electrically connected to the external terminals through the interconnection layer;

wherein one of a respective first alignment solder part and a corresponding second alignment solder part is a solder bump, and the other of the respective first alignment solder part and the corresponding second alignment solder part is a solder pad or a solder bump;

wherein at least the first or second alignment solder bumps are made of solder, and soldering is performed by melting the solder;

wherein viscous flux is pre-coated on the first alignment solder parts and/or the second alignment-solder parts, and the method further comprises: before the soldering is performed, turning the at least one semiconductor device together with the carrier board over as a whole so that the active surfaces of the set of semiconductor devices are downward faced; and wherein the alignment solder joints are formed when the active surfaces of the set of semiconductor devices face downward to allow weight of each respective semiconductor device of the set of semiconductor devices elongates corresponding alignment solder joints during soldering, causing the respective semiconductor device to be further aligned to the carrier board.

18. A semiconductor packaging method according to claim 17, further comprising: after melting or partially melting the alignment solder joints, flattening the active surfaces of the set of semiconductor devices using a flattening plate until the alignment solder joints are solidified so that the active surfaces of the plurality of semiconductor devices are positioned in a same plane parallel to the carrier board, and subsequently removing the flattening plate.

19. A semiconductor packaging method, comprising:

providing a set of semiconductor devices and a carrier board, the set of semiconductor devices having respective active surfaces and opposing passive surfaces, connection terminals formed on the active surfaces, and first alignment solder parts formed on the passive surfaces, the carrier board having second alignment solder parts respectively corresponding to the first alignment solder parts, wherein one of a respective first alignment solder part and a corresponding second alignment solder part is a solder bump, and the other of the respective first alignment solder part and the corresponding second alignment solder part is a solder pad or a solder bump;

placing the set of semiconductor devices on the carrier board such that the first alignment solder parts contact respective ones of the second alignment solder parts;

forming alignment solder joints by soldering the first alignment solder parts to respective ones of the second alignment solder parts whereby the set of semiconductor devices are aligned and fixed to the carrier board, wherein at least the first or second alignment solder bumps are made of solder, and soldering is performed by melting or partially melting the solder and subsequently cooling the solder;

after forming the alignment solder joints, further aligning the set of semiconductor devices to the carrier board by: turning the set of semiconductor devices and the carrier board as a whole to enable the active surfaces to face downwards, melting or partially melting the solder in the alignment solder joints again to cause the alignment solder joints to be elongated by weight of corresponding semiconductor devices of the set of semiconductor devices, and subsequently cooling and solidifying the solder again while the active surfaces face downwards;

encapsulating the set of semiconductor device using a molding compound to form a molded package body on a side of the carrier board where the set of semiconductor device are disposed;

exposing the connection terminals from the molded package body; and sequentially forming an interconnection layer and external terminals on a side of the molded package body where the connection terminals are exposed, wherein the connection terminals are electrically connected to the external terminals through the interconnection layer.

20. A semiconductor packaging method according to claim 19, further comprising: while the alignment solder joints are melted or partially melted and the active surfaces face downwards, pressing a flattening plate on the active surfaces to cause the active surfaces to lie substantially in a same plane parallel to the carrier board before cooling the solder and removing the flattening plate.

* * * * *